United States Patent [19]

Iwahara et al.

[11] Patent Number: 5,107,324
[45] Date of Patent: Apr. 21, 1992

[54] TWO-TERMINAL SEMICONDUCTOR DEVICE OF SURFACE INSTALLATION TYPE

[75] Inventors: Mitsumasa Iwahara; Misuo Tershima, both of Kanagawa, Japan

[73] Assignee: Fuji Electric Co., Ltd., Kanagawa, Japan

[21] Appl. No.: 514,018

[22] Filed: Apr. 26, 1990

[30] Foreign Application Priority Data

Apr. 27, 1989 [JP] Japan ................ 1-108531
Dec. 27, 1989 [JP] Japan ................ 1-339506

[51] Int. Cl.$^5$ .............. H01L 23/48; H01L 29/44; H01L 29/52; H01L 29/60
[52] U.S. Cl. .................. 357/68; 357/72; 357/69; 357/74; 361/405; 361/404; 174/52.5
[58] Field of Search .......... 357/68, 72, 74, 70, 357/69; 361/400, 404, 405; 174/525

[56] References Cited

U.S. PATENT DOCUMENTS 2,486,482  11/1949  Brie ................ 357/74
2,644,914  7/1953  Kircher ............ 357/74
3,056,939  10/1962  Rayburn ........... 361/405

FOREIGN PATENT DOCUMENTS 2508702  9/1976  Fed. Rep. of Germany ...... 361/405
63-55550  4/1988  Japan .
63-55551  4/1988  Japan .

Primary Examiner—Rolf Hille
Assistant Examiner—David Ostrowski
Attorney, Agent, or Firm—Finnegan, Henderson, Farabow, Garrett and Dunner

[57] ABSTRACT

A two-terminal semiconductor device of surface installation type comprising: a semiconductor chip hermetically enclosed in a package; and lead pins protruded from both end faces of the package with the semiconductor chip held between the inner ends thereof, characterized in that the lead pins protruded from both end faces of the package have outer end portions which are each formed into a flat-plate-shaped soldering leg by pressing, and the lead pins are formed into a hairpin shape in such a manner that the soldering legs are flush with each other.

8 Claims, 5 Drawing Sheets

TWO-TERMINAL SEMICONDUCTOR DEVICE OF SURFACE INSTALLATION TYPE

BACKGROUND OF THE INVENTION

This invention relates to a two-terminal semiconductor device of surface installation type such as a semiconductor diode, and more particularly to the structure of the lead terminals thereof.

In one example of a conventional two-terminal semiconductor device of surface installation type, a semiconductor chip is mounted on a lead frame and hermetically packaged with resin as shown in FIGS. 10 and 11. In these figures, reference numeral 1 designates a semiconductor chip; 2, a resin package which hermetically seals the semiconductor chip 1; 3, lead strips extended from the package 2; and 4, an auxiliary lead strip.

A method of manufacturing the semiconductor device thus constructed will be described with reference to FIGS. 11(a)–11(d). As shown in FIG. 11(a), the semiconductor chip 1 is mounted on a predetermined portion of a lead frame 5 which is formed by pressing a metal plate into a desired shape, and the auxiliary lead strip 4 is soldered to the semiconductor chip 1 and another lead frame 5. Thereafter, as shown FIG. 11(b), the semiconductor chip 1 is packaged by transfer molding; that is, the resin package 2 is formed. Under this condition, the lead frames 5 are cut along one-dot chain lines, to form a semiconductor device as shown in FIG. 11(c). Then, as shown in FIG. 11(d), the lead strips 3 extended from both end faces of the package 2 are subjected to forming work, more specifically, they are bent downwardly and then inwardly in such a manner that the outer end portions of the lead strips 3 are flush with each other, so that they are deformed into a hairpin shape.

The semiconductor device thus formed is installed on a printed circuit board as follows: The semiconductor device is mounted on the printed circuit board through the outer end portions of the lead strips 3, and the latter are secured to the printed circuit board by reflow soldering for instance.

The above-described conventional two-terminal semiconductor device of surface installation type, when manufactured and handled, suffers from the following difficulties:

(1) The semiconductor chips 1 are mounted on the lead frames 5 which are designed only for the semiconductor device. Therefore, the cost of manufacturing the lead frames including the metal mold is considerably high.

(2) In order to connect the semiconductor chip to the lead strip 3 of the lead frame 5, it is necessary to use the auxiliary lead strip 4 and to solder it.

(3) During manufacturing, the semiconductor devices are integrally coupled to one another through the side rails and the tie bars of the lead frames, and therefore they cannot be tested until the lead frames are cut as was described above.

SUMMARY OF THE INVENTION

In view of the foregoing, an object of this invention is to provide a two-terminal semiconductor device of surface installation type in which the above-described difficulties accompanying a conventional two-terminal semiconductor device of surface installation type have been eliminated, and which can be formed at low manufacturing cost.

The foregoing object of the invention has been achieved by the provision of a two-terminal semiconductor device of surface installation type comprising: a semiconductor chip hermetically enclosed in a package; and lead pins protruded from both end faces of the package with the semiconductor chip held between the inner ends thereof; in which, according to the invention, the lead pins protruded from both end faces of the package have outer end portions which are each formed into a flat-plate-shaped soldering leg by pressing, and the lead pins are bent into a hairpin shape in such a manner that the soldering legs are flush with each other.

In order to solder the semiconductor device to a printed circuit board with high efficiency, according to the invention, before the outer end portion of each lead pin is formed into the soldering leg by pressing, a metal cover layer may be formed on the outer end portion to a thickness of from 1 $\mu$m to 10 $\mu$m.

For the same purpose, in the semiconductor device of the invention, after the outer end portion of each lead pin is formed into the soldering leg by pressing, a metal cover layer high in solderability may be formed on the soldering leg.

The two-terminal semiconductor device of surface installation type thus constructed can realize the lead terminal structure which permits the surface installation of the semiconductor device using leads pins which are made of round wire similarly as in the conventional coaxial lead semiconductor device of surface installation. In the lead terminal structure, the outer end portion of each lead pin is formed into the flat-plate-shaped soldering leg by pressing. Hence, the semiconductor device can be stably mounted on a printed circuit board through the soldering legs.

Before the outer end portion of each lead pin is formed into the soldering leg by pressing, the metal cover layer of metal material such as solder or silver high in solderability is formed on the outer end portion to a thickness of 1 to 10 $\mu$m. Therefore, when pressed to form the soldering leg, the outer end portion of the lead will be free from the difficulty that the metal cover layer is peeled off by the pressure to expose the base metal of the lead pin. Accordingly, the soldering leg can be positively welded to the printed circuit board. The metal cover layer can be readily formed by a surface treating method such as a dipping method or plating method.

Furthermore, according to the invention, the metal cover layer is formed on the soldering leg which has been formed by pressing the outer end portion of each lead pin. In this case, the metal cover layer can be stably formed on the soldering leg, being not affected by the pressure during pressing. Thus, the soldering legs can be satisfactorily soldered to the printed circuit board.

DETAILED DESCRIPTION OF THE INVENTION

Embodiments of the present invention will be described with reference to the accompanying drawings.

Figure 1:
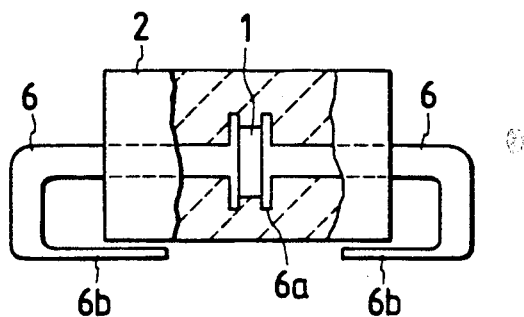
FIG. 1 is a front view, with parts cut away, showing the structure of one example of a two-terminal semiconductor device of surface installation type according to the invention.
Figure 2:
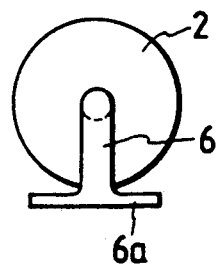
FIGS. 2 and 3 are a side view and a bottom view of the semiconductor device shown in FIG. 1, respectively.
Figure 3:
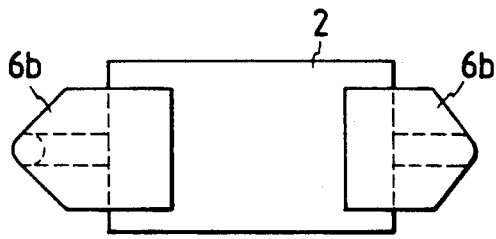

FIGS. 1 through 3 shows the structure of one embodiment of the invention. In these figures, reference numeral 1 designates a semiconductor chip; 2, a resin package hermetically enclosing the semiconductor chip 1; and 6, round wires, namely, lead pins. The semiconductor chip 1 is held between the inner ends of the lead pins 6, which are coaxially protruded through both ends of the package 2. The inner end portions of the lead pins 6 are formed into disk-shaped electrode headers 6a by pressing, while the outer end portions of the pins 6 protruded through both ends of the package 2 are formed into flat-plate-shaped soldering legs 6b. The lead pins 6 are subjected to forming work to be formed into a hairpin shape so that the soldering legs 6b are flush with each other under the lower surface of the package 2.

The surface installation type semiconductor device is mounted on a printed circuit board through the flat-plate-shaped soldering legs 6b, which are secured to the printed circuit board by reflow soldering.

Figure 4A:
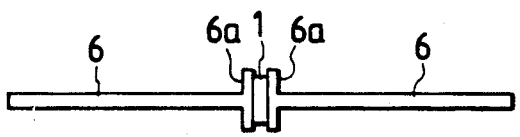
FIGS. 4(a)–4(d) are diagrams for a description of one example of a method of manufacturing the semiconductor device shown in FIG. 1, FIGS. 5(a)-5(e) are diagrams for a description of another example of the method of manufacturing the semiconductor device.
Figure 4C:
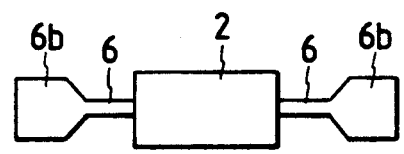
Figure 4B:
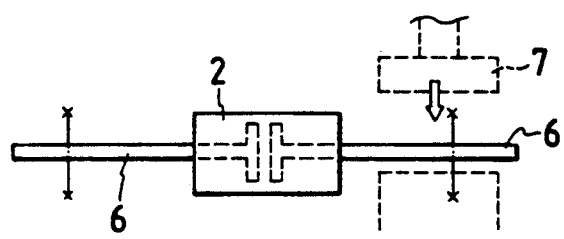
Figure 4D:
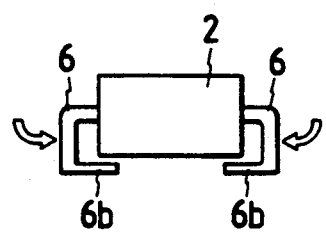

A first example of a method of manufacturing the semiconductor device thus constructed will be described with reference to FIG. 4. First, a round wire is cut to a predetermined length to obtain a lead pin 6. One end portion of the lead pin 6 is previously formed into the electrode header 6a through pressing. As shown in FIG. 4(a), the lead pins 6 thus formed are laid in a line to hold the semiconductor chip 1 therebetween, and the electrode headers 6a are connected to the semiconductor chip 1 by soldering for instance. Then, as shown in FIG. 4(b), the assembly of the semiconductor chip 1 and the lead pins 6 is inserted into a metal mold, and the resin package 2 is formed in such a manner as to hermetically seal the semiconductor chip 1. The lead pins 6, which are protruded through the resin package 2, are cut to a predetermined length (as indicated at the one-dot chain lines). The outer end portions of the lead pins 6 thus cut are formed into the flat-plate-shaped soldering legs 6b as shown in FIG. 4(c). Finally, the lead pins 6 protruded from the package 2 are bent inwardly to be formed into the hairpin shape, so that the soldering legs 6b are flush with each other under the lower surface of the package 2.

The electrode heads 6a of the lead pins 6 may be connected to the semiconductor device 1 by pressure welding instead of soldering. In this case, it is desirable to use glass for instance instead of resin to form the package 2.

Figure 5A:
Figure 5D:
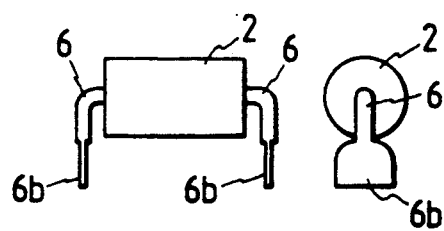
Figure 5B:
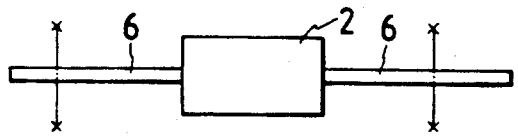
Figure 5E:
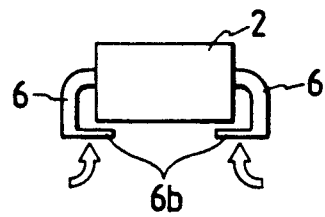
Figure 5C:
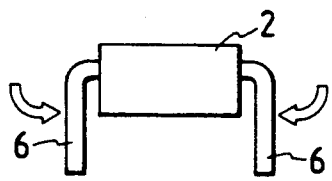

A second example of the method will be described with reference to FIG. 5. As shown in FIGS. 5(a) and 5(b), the electrode headers of lead pins 6 are welded to the semiconductor chip 1, and a package 2 is formed in such a manner as to hermetically seal the semiconductor chip 1. Thereafter, as shown in FIG. 5(c), the lead pins 6 protruded from the package 2 are bent downwardly substantially at right angles. Then, as shown in FIG. 5(d), the outer end portions of the pins 6 thus bent are formed into flat-plate-shaped soldering legs 6b by pressing. Under this condition, the lead pins 6 are bent inwardly in such a manner that the flat-plate-shaped soldering legs 6b are flush with each other under the lower surface of the package 2, as shown in FIG. 5(e).

Figure 6:
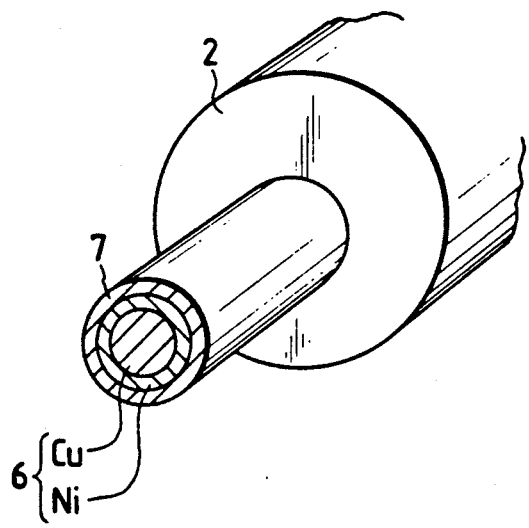
FIGS. 6 and 7 are perspective views showing examples of a lead pin covered with a metal cover layer high in solderability, respectively.
Figure 7:
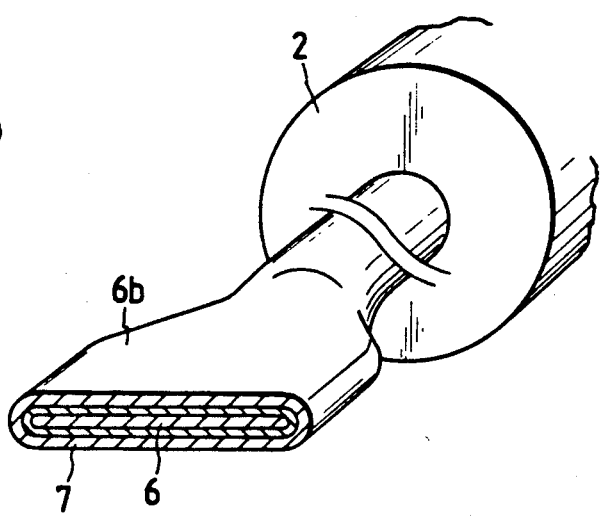

FIGS. 6 and 7 show two other examples of the semiconductor device according to the invention in which the lead pins are previously subjected to surface treatment in order to facilitate the operation of soldering the semiconductor device to a printed circuit board.

That is, as shown in FIG. 6, before the outer end portions of the lead pins 6 protruded from the package 2 are formed into the soldering legs 6b by pressing, the lead pins 6 are subjected to surface treatment; that is, they are covered with a metal cover layer 7 of solder or silver to facilitate the soldering operation. In the case where the lead pins 6 are made of a copper wire plated with nickel (Ni), first they are surface-treated with highly active flux, and then the metal cover layers 7 are formed on them by dipping or soldering.

Figure 8:
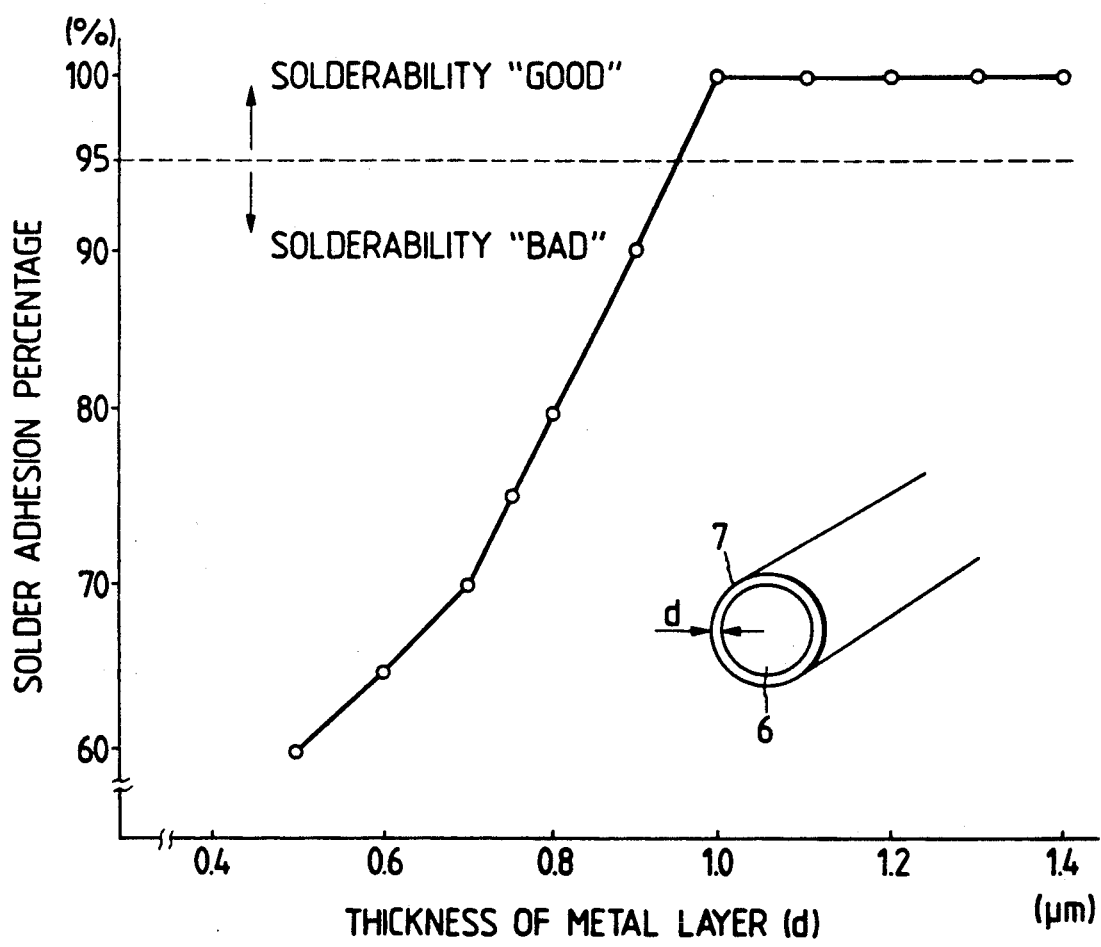
FIG. 8 is a characteristic diagram showing the results of solderability tests given to the lead pin shown in FIG. 6, FIGS. 9(a)-9(d) are diagrams showing modifications of the semiconductor device according to the invention.

If the metal cover layer 7 is small in thickness, then, when in the following manufacturing step the outer end portion of the lead pin 6 is formed into the flat-plate-shaped soldering leg by pressing, the metal cover layer 7 may be locally peeled off by the pressure to expose the nickel layer (low in wettability with solder) plated on the copper core; that is, the soldering leg may not be sufficiently soldered to the printed circuit board. Hence, the thickness of the metal cover layer 7 should be at least 1 μm. In this case, when the outer end portion of the lead pin is pressed to form the soldering leg, the metal cover plate 7 will not be peeled off, and the soldering leg can be satisfactorily soldered to the printed circuit board. FIG. 8 shows the results of soldering tests carried out as follows: Specimens were prepared by forming the outer end portion of each lead pin 6 covered with the metal cover layer 7 into the soldering legs by pressing. The specimens thus prepared were immersed in a solder bath in accordance with the solderability test method regulated by JIS (Japanese Industrial Standard) C7021, A-2 and evaluated in accordance with paragraphs 3 and 4 of the standard. As is apparent from the results of tests shown in FIG. 8, it has been confirmed that, where the thickness (d) of the metal cover layer (solder) formed on the lead pin 6 is not less than 1 μm, then the solder adhesion percentage of the immersed part is 95% or more; that is, the solderability is excellent. However, it is desirable that the thickness of the metal cover layer 7 is not more than 10 μm, in view of surface treatment time and of economy as in manufacturing cost etc.

In the case of FIG. 7, the outer end portion of the lead pin 6 is formed into the soldering leg 6b by pressing (as sown in of FIG. 4(c) or in FIG. 5(d)), and then it is covered with the metal cover layer 7. Since the soldering leg 6b of the lead pin 6 is formed by pressing and then covered with the metal cover layer 7 as was described above, the difficult is completely eliminate that, in the case of FIG. 6, the metal cover layer may be peeled off when pressed. That is, in the case of FIG. 7, the lead pin is more improved in solderability.

Modifications of the semiconductor device shown in FIGS. 1 through 3 will be described with reference to FIG. 9. In the modifications, the package 2 are modified in various manners.

Figure 9A:
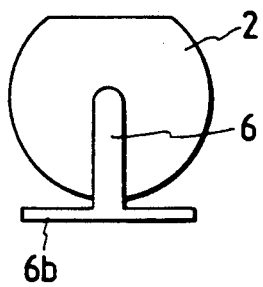
Figure 9B:
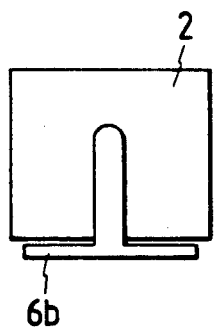
Figure 9C:
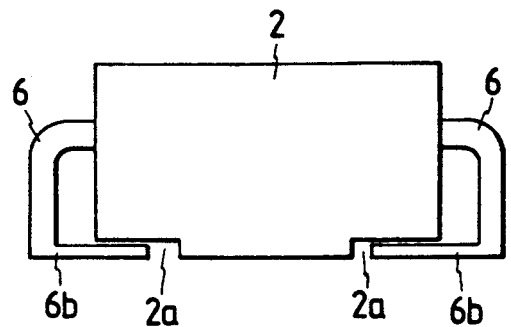
Figure 9D:
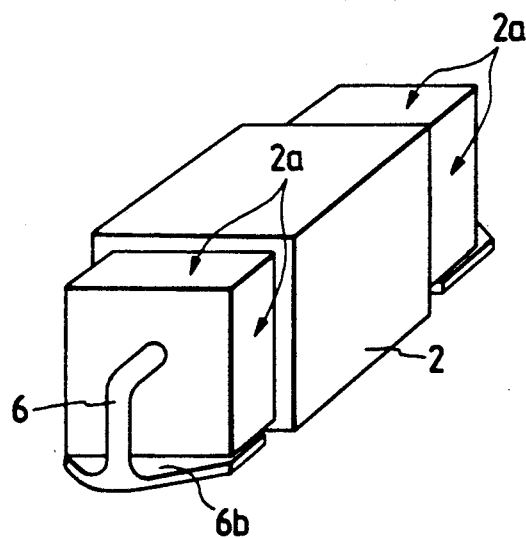
Figure 10:
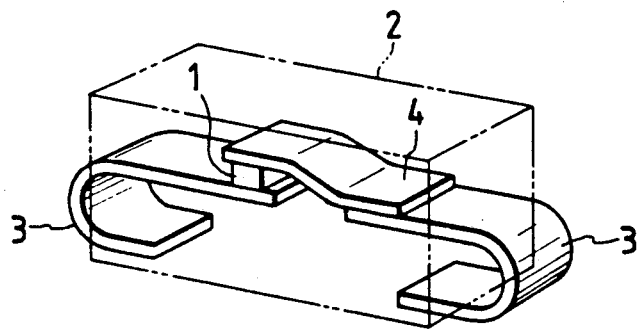
FIG. 10 is a perspective view showing the structure of a conventional two-terminal semiconductor device of surface installation type.
Figure 11A:
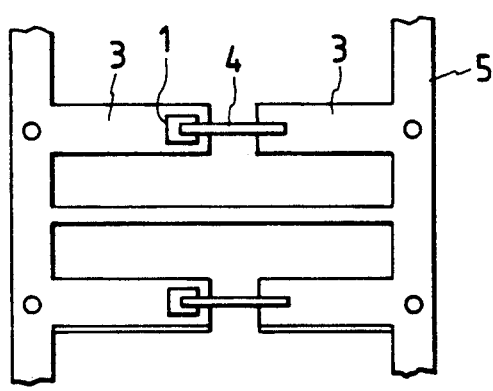
FIGS. 11(a)-11(d) are diagrams for a description of a method of manufacturing the semiconductor device shown in FIG. 10.
Figure 11B:
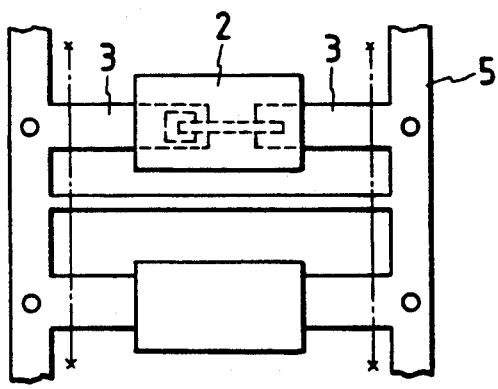
Figure 11C:
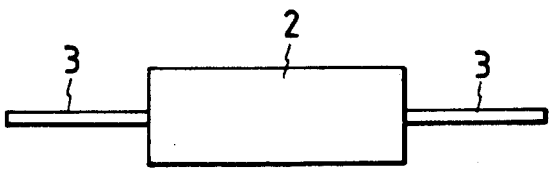
Figure 11D:
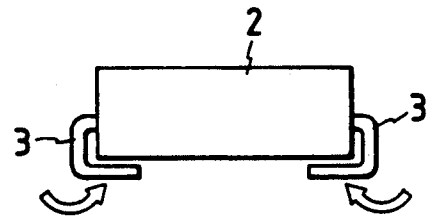

In the first modification, as shown in FIG. 9(a), the package 2 is in the form of a cylinder with a flat top surface. In handling the semiconductor device with an automatic semiconductor device installing machine, the package 2 can be stably taped or picked up. For the same purpose, in the second modification shown in FIG. 9(b), the package 2 is in the form of a prism such as a quadrangular prism or polygonal prism. In the third modification as shown in FIG. 9(c), recesses (or undercuts) 2a are formed at the lower sides of both end faces of the package 2, and the soldering legs 6b of the lead pins 6 are held in the recesses 2a in such a manner that they are flush with the lower surface of the package 2. This structure allows the semiconductor device to stably mount on the printed circuit board, and prevents the soldering legs from being deformed by external force during handling of the semiconductor device. In the fourth modification as shown in FIG. 9(d), the recesses 2a shown in FIG. 9(c) are formed at all the sides of two end faces of the package 2 (in the form of a quadrangular prism). This modification is advantageous in that, when the lead pins 6 are bent with an automatic lead bending machine for instance (as shown in of FIG. 4(d) or in FIG. 5(c)), the direction of the package 2 can be freely selected The two-terminal semiconductor device of surface installation type thus constructed has the following effects or merits:

(1) The outer end portions of the lead pins protruded from the package are formed into the flat-plate-shaped soldering legs, and the lead pins are bent inwardly in such a manner that they are flush with each other under the package. Therefore, in manufacturing the semiconductor device, it is unnecessary to use the lead frame which is designed only for the semiconductor device and is accordingly expensive. That is, the semiconductor device of the invention, employing the lead pins of cheap round wire similarly as in the case of a conventional coaxial lead type semiconductor, can be stably mounted on the printed circuit board by surface installation.

(2) Before or after the soldering legs are formed by pressing, it is covered with the metal cover layer excellent in solderability. Therefore, the soldering legs can be positively soldered to the printed circuit board. In the case where the soldering leg is covered with the metal cover layer to a thickness of 1 through 10 μm before pressed, the difficulty is eliminated that the metal cover layer is locally peeled off to expose the base metal of the lead pin; that is, the soldering leg is high in solderability.

(3) Thus, the two-terminal semiconductor of surface installation type according to the invention can be fabricated at low manufacturing cost, stably surface-installed on a printed circuit board, and can be satisfactorily soldered to the latter.

What is claimed is:

1. A two-terminal semiconductor device of surface installation type, comprising:
    a semiconductor chip;
    a package, having end surfaces facing in generally opposite directions, hermetically enclosing said semiconductor chip; and
    a pair of lead pins, each having an inner end portion disposed in the package holding the semiconductor chip, and a flat outer end portion exterior to and protruding from respective end surface, each said flat outer end portion being bent inwardly such that they are spaced opposing one another in parallel planes between the end faces of the package and opposing the package, each said flat portion being covered with a layer of metal having good solderability to an external surface, said layer of metal having a thickness within a range of 1 μm to 10 μm.

2. A two-terminal semiconductor device of surface installation type as claimed in claim 1, wherein said package is in the form of a prism.

3. The device of claim 1, wherein the outer end portion of the lead is formed into a flat portion prior to the forming of the layer of a metal having good solderability thereon.

4. The device of claim 1, wherein the outer end portion of the lead is formed into a flat portion subsequent to the forming of the layer of a metal having good solderability thereon.

5. A two-terminal semiconductor device of surface installation type as claimed in claim 1, wherein each said lead pin between the inner end portion and flat outer end portion is substantially circular in cross-section.

6. A two-terminal semiconductor device of surface installation type comprising:
    a semiconductor chip;
    a package having end surfaces facing in generally opposite directions and hermetically enclosing said semiconductor chip; and
    a pair of lead pins, each having an inner end portion disposed in the package holding the semiconductor chip, and a flat outer end portion exterior to and protruding from respective end surface, each said flat outer end portion being bent inwardly such that they are spaced opposing one another in parallel planes between the end faces of the package and opposing the package, each said flat portion being solderable to an external surface,
    said package being arcuate in cross-section with a flat surface substantially parallel to the plane of the flat outer end portions of the lead pins.

7. A two-terminal semiconductor device of surface installation type comprising:
    a semiconductor chip;
    a package having end surfaces facing in generally opposite directions and hermetically enclosing said semiconductor chip; and
    a pair of lead pins, each having an inner end portion disposed in the package holding the semiconductor chip, and a flat outer end portion exterior to and protruding from respective end surface, each said flat outer end portion being bent inwardly such that they are spaced opposing one another in parallel planes between the end faces of the package and opposing the package, each said flat portion being solderable to an external surface;
    said package having spaced planar surface portions adjacent the end surfaces defining a pair of recesses, said flat outer end portions being disposed parallel to the defined recesses.

8. A two-terminal semiconductor device of surface installation type comprising:

a semiconductor chip;

a package having end surfaces facing in generally opposite directions and hermetically enclosing said semiconductor chip, the package having a central portion of increased dimension in cross-section defining a perimetrical spaced pair of recesses; and a pair of lead pins, each having an inner end portion disposed in the package holding the semiconductor chip, and a flat outer end portion exterior to and protruding from respective end surface, each said flat outer end portion being bent inwardly such that they are spaced opposing one another in parallel planes between the end faces of the package and opposing the package, each said flat portion being solderable to an external surface.

* * * * *

UNITED STATES PATENT AND TRADEMARK OFFICE
CERTIFICATE OF CORRECTION

PATENT NO. : 5,107,324

DATED : April 21, 1992

INVENTOR(S) : Mitsumasa Iwahara, et. al.

It is certified that error appears in the above-indentified patent and that said Letters Patent is hereby corrected as shown below:

On the Title page, item [75], Inventor: change "Misuo Tershima" to-- Misuo Terashima--.

Claim 1, column 6, line 14, after "range" change "of" to --from--.

Signed and Sealed this

Twenty-eighth Day of September, 1993

*Attest:*

BRUCE LEHMAN

*Attesting Officer*  *Commissioner of Patents and Trademarks*